United States Patent
Balakrishnan et al.

(10) Patent No.: US 10,297,686 B2
(45) Date of Patent: *May 21, 2019

(54) TAPERED VERTICAL FET HAVING III-V CHANNEL

(71) Applicant: INTERNATIONAL BUSINESS MACHINES CORPORATION, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/658,746

(22) Filed: Jul. 25, 2017

(65) Prior Publication Data

US 2018/0053845 A1 Feb. 22, 2018

Related U.S. Application Data

(63) Continuation of application No. 15/240,598, filed on Aug. 18, 2016, now Pat. No. 9,859,420.

(51) Int. Cl.
| | |
|---|---|
| *H01L 29/06* | (2006.01) |
| *H01L 29/78* | (2006.01) |
| *H01L 21/02* | (2006.01) |
| *H01L 29/08* | (2006.01) |
| *H01L 29/20* | (2006.01) |
| *H01L 29/10* | (2006.01) |

(Continued)

(52) U.S. Cl.
CPC ...... *H01L 29/7827* (2013.01); *H01L 21/0243* (2013.01); *H01L 21/0257* (2013.01); *H01L 21/02538* (2013.01); *H01L 29/0847* (2013.01); *H01L 29/1037* (2013.01); *H01L 29/1079* (2013.01); *H01L 29/20* (2013.01); *H01L 29/4238* (2013.01); *H01L 29/66977* (2013.01)

(58) Field of Classification Search
CPC ....... H01L 29/66795; H01L 21/823431; H01L 29/7853; H01L 29/1037
See application file for complete search history.

(56) References Cited

U.S. PATENT DOCUMENTS

| | | |
|---|---|---|
| 6,097,046 A | 8/2000 | Plumton |
| 6,309,918 B1 | 10/2001 | Huang et al. |
| 7,230,286 B2 | 6/2007 | Cohen et al. |

(Continued)

OTHER PUBLICATIONS

Moroz, V. et al., "Modeling and Optimization of Group IV and III-V FinFETs and Nano-Wires" IEEE International Electron Devices Meeting (Dec. 2014) pp. 7.4.1-7.4.4.

(Continued)

*Primary Examiner* — Jaehwan Oh
(74) *Attorney, Agent, or Firm* — Tutunjian & Bitetto, P.C.; Vazken Alexanian

(57) ABSTRACT

A vertical field effect transistor includes a first source/drain region formed on or in a substrate. A tapered fin is formed a vertical device channel and has a first end portion attached to the first source/drain region. A second source/drain region is formed on a second end portion of the tapered fin. A gate structure surrounds the tapered fin.

20 Claims, 11 Drawing Sheets

(51) Int. Cl.
*H01L 29/423* (2006.01)
*H01L 29/66* (2006.01)

(56) References Cited

U.S. PATENT DOCUMENTS

| | | | |
|---|---|---|---|
| 7,462,891 B2 | 12/2008 | Brar et al. | |
| 8,932,940 B2 | 1/2015 | Wang et al. | |
| 8,969,145 B2 | 3/2015 | Chang et al. | |
| 9,159,552 B2* | 10/2015 | Fan | H01L 29/0653 |
| 9,209,271 B1 | 12/2015 | Lee et al. | |
| 9,525,064 B1 | 12/2016 | Balakrishnan et al. | |
| 9,589,845 B1* | 3/2017 | Jagannathan | H01L 21/823431 |
| 9,754,968 B2 | 9/2017 | Mochizuki et al. | |
| 9,837,405 B1* | 12/2017 | Cheng | H01L 27/0886 |
| 9,859,420 B1* | 1/2018 | Balakrishnan | H01L 29/7827 |
| 2006/0027870 A1* | 2/2006 | Inaba | H01L 27/1203 257/353 |
| 2011/0298041 A1* | 12/2011 | Renn | H01L 27/10826 257/330 |
| 2013/0256764 A1* | 10/2013 | Liaw | H01L 29/7853 257/288 |
| 2014/0308806 A1* | 10/2014 | Chang | H01L 21/306 438/585 |
| 2016/0118500 A1* | 4/2016 | Wu | H01L 29/7851 257/401 |
| 2016/0247685 A1* | 8/2016 | Chen | H01L 21/3086 |
| 2016/0308045 A1 | 10/2016 | Moens et al. | |
| 2017/0005005 A1* | 1/2017 | Chen | H01L 21/823437 |
| 2017/0005090 A1* | 1/2017 | Ando | H01L 27/0886 |
| 2018/0006024 A1* | 1/2018 | Anderson | H01L 27/088 |

OTHER PUBLICATIONS

Yakimets, D. et al., "Vertical GAAFETs for the Ultimate CMOS Scaling" IEEE Transactions on Electron Devices (May 2015) pp. 1433-1439, vol. 62, No. 5.

Nikhil, K.S. et al., "Feasibility Study of Conical Channel Nanowire MOSFETs for Improved Performance" Procedia Engineering (2012) pp. 2364-2370, vol. 38.

Vardi, V. et al., "Quantum-size effects in sub 10-nm fin width InGaAs FinFETs" IEEE International Electron Devices Meeting (IEDM), (2015) pp. 31.3.1-31.3.4.

List of IBM Patents or Patent Applications Treated as Related dated Jul. 25, 2017, 2 pages.

* cited by examiner

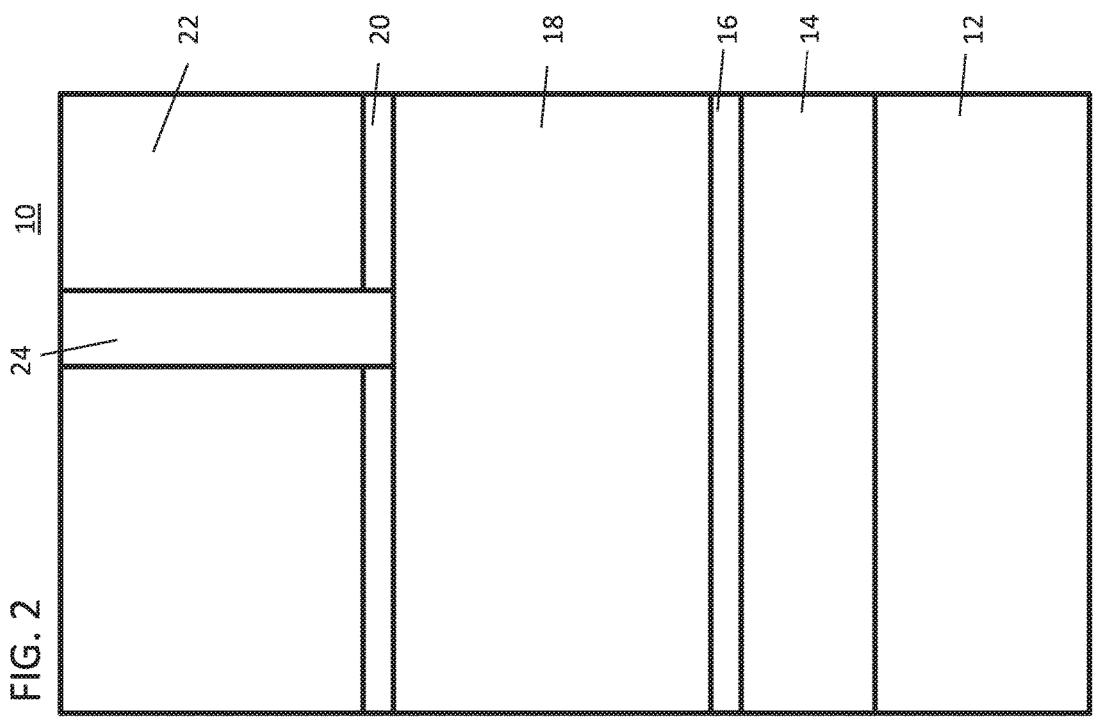
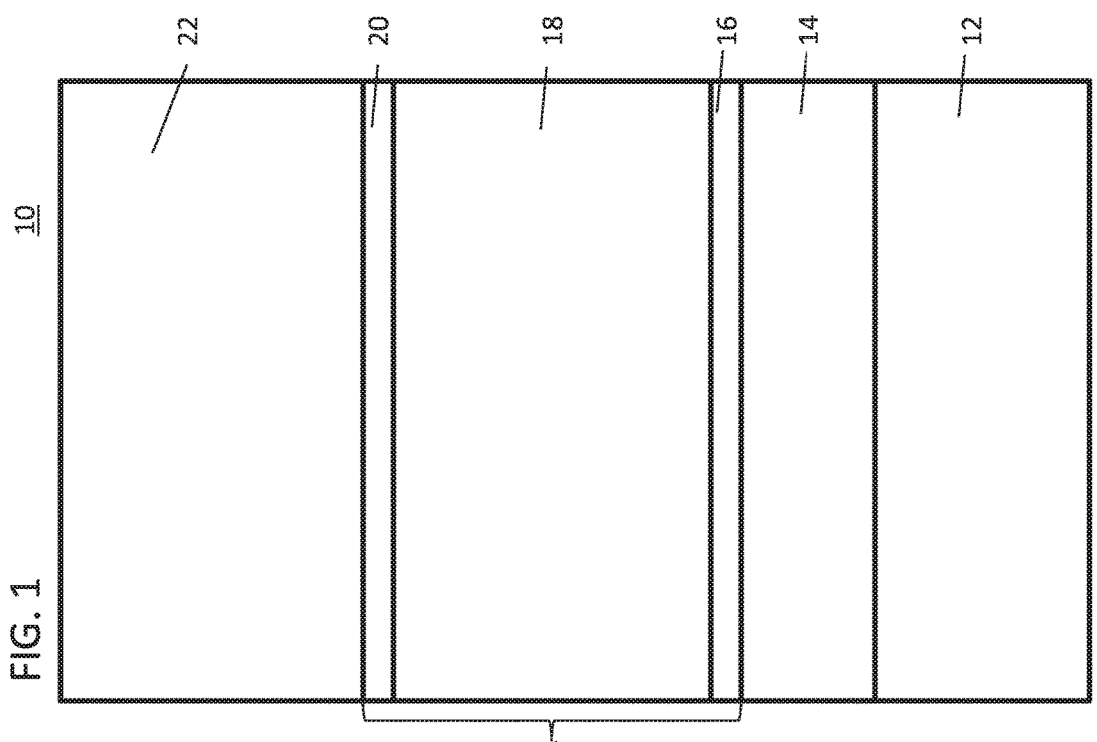

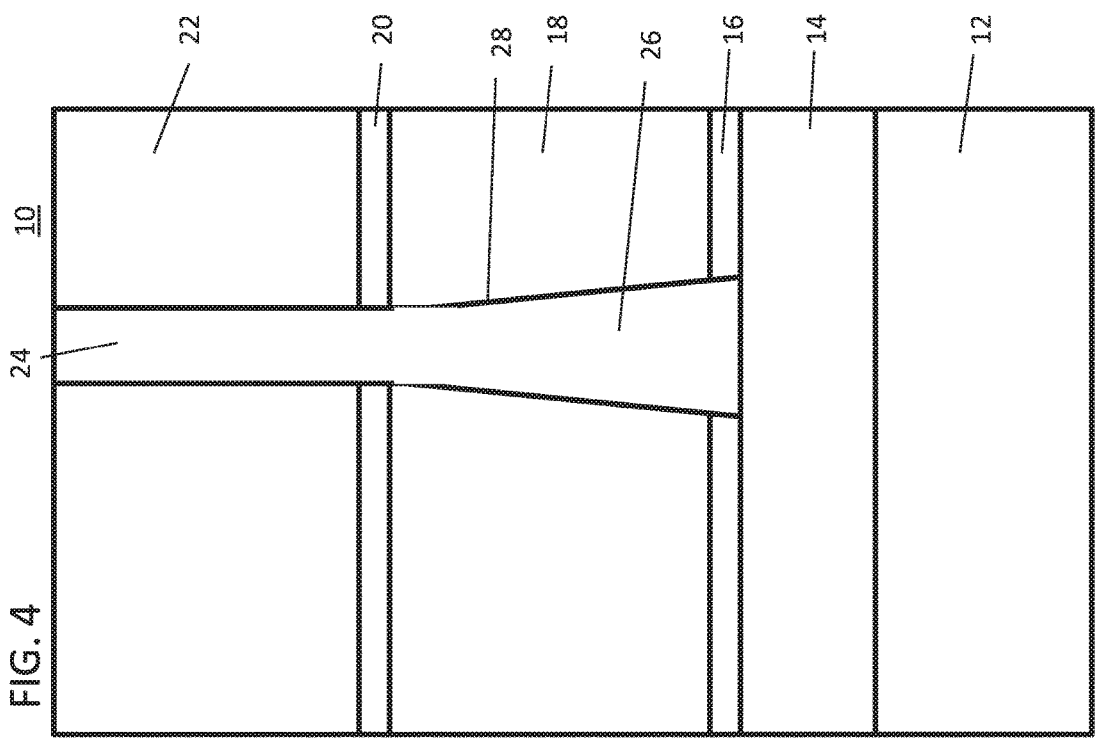
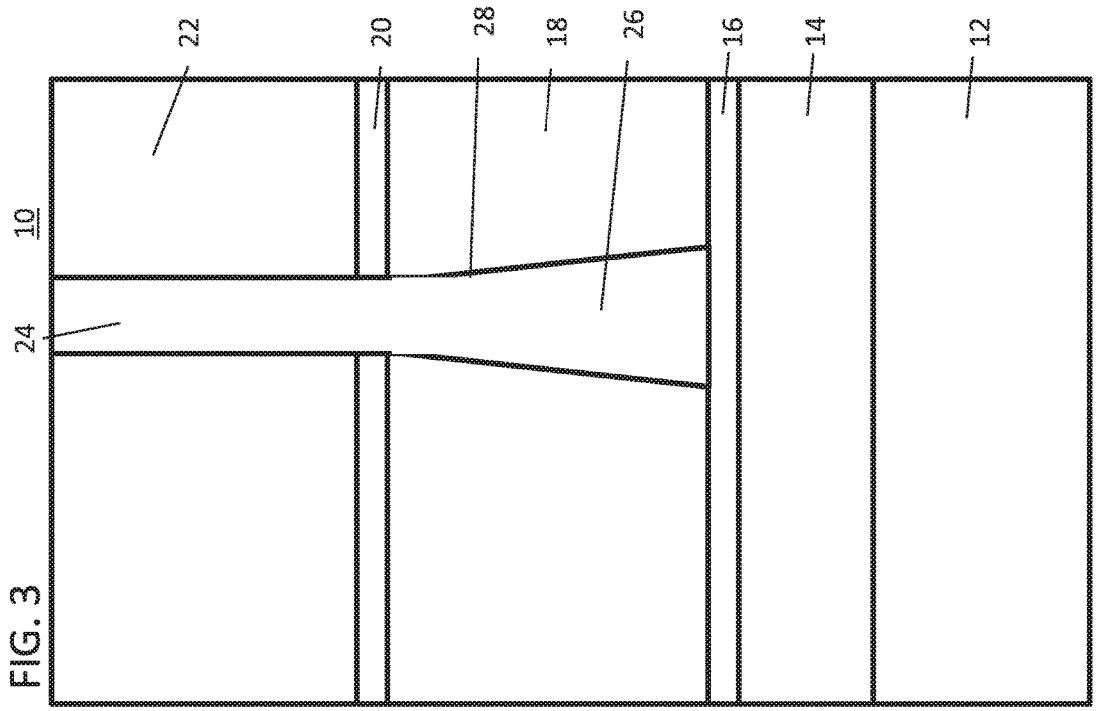

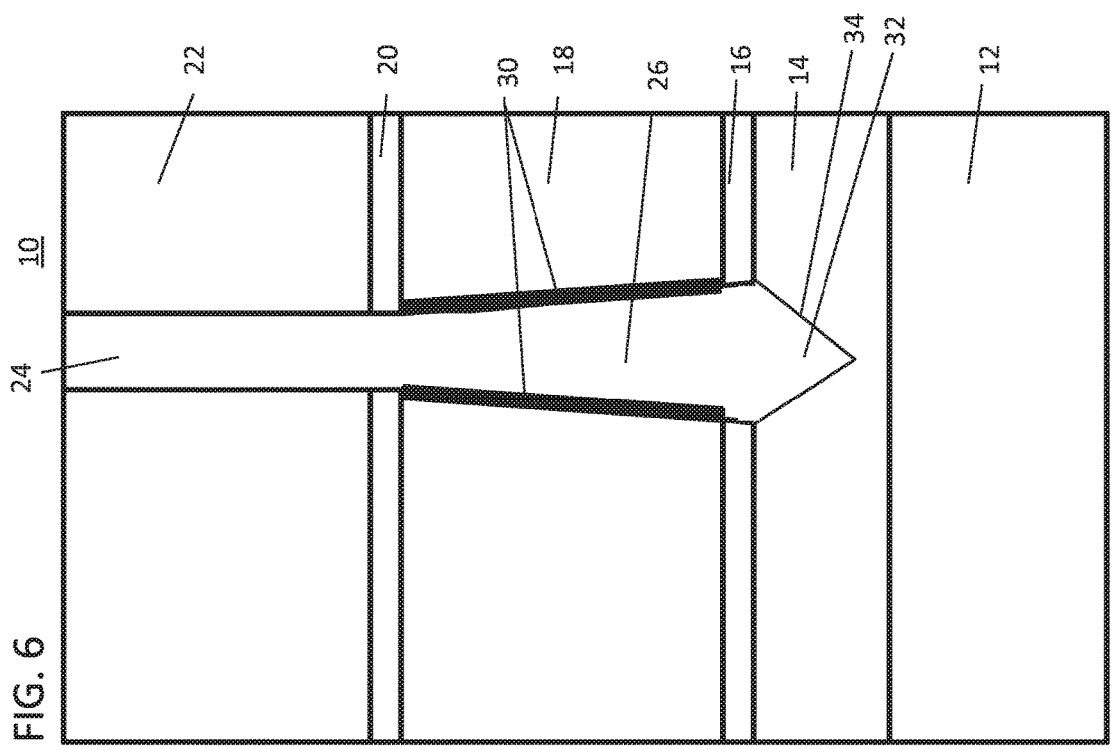
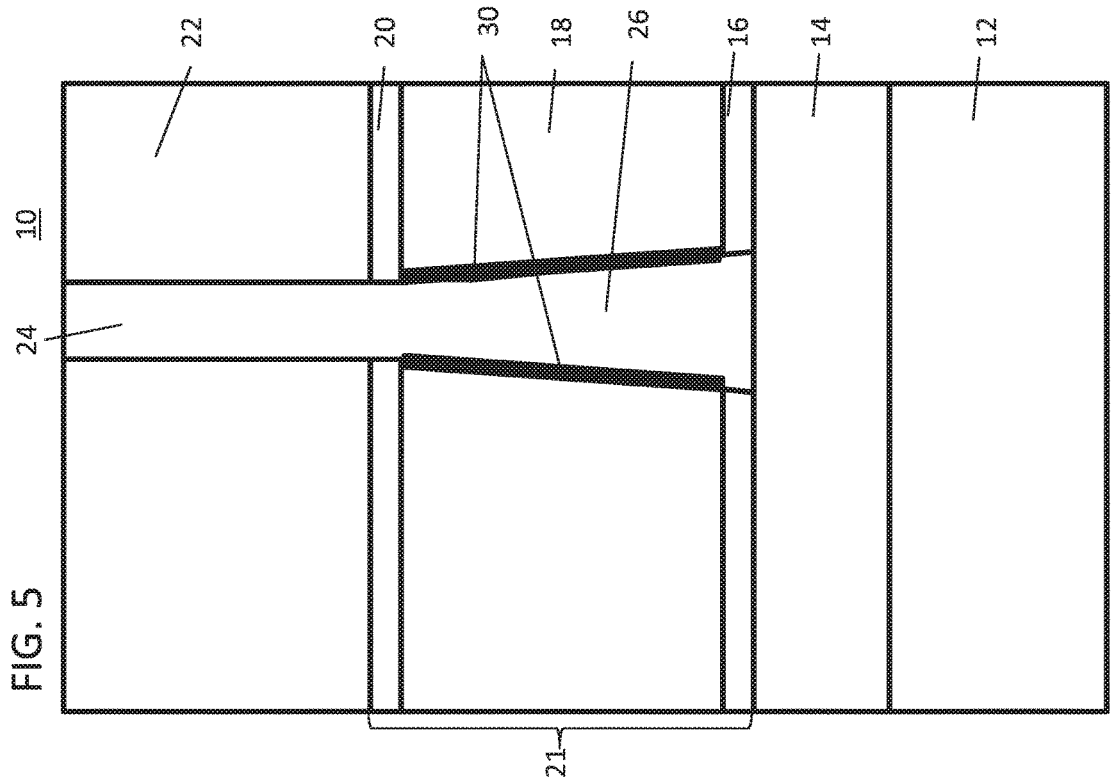

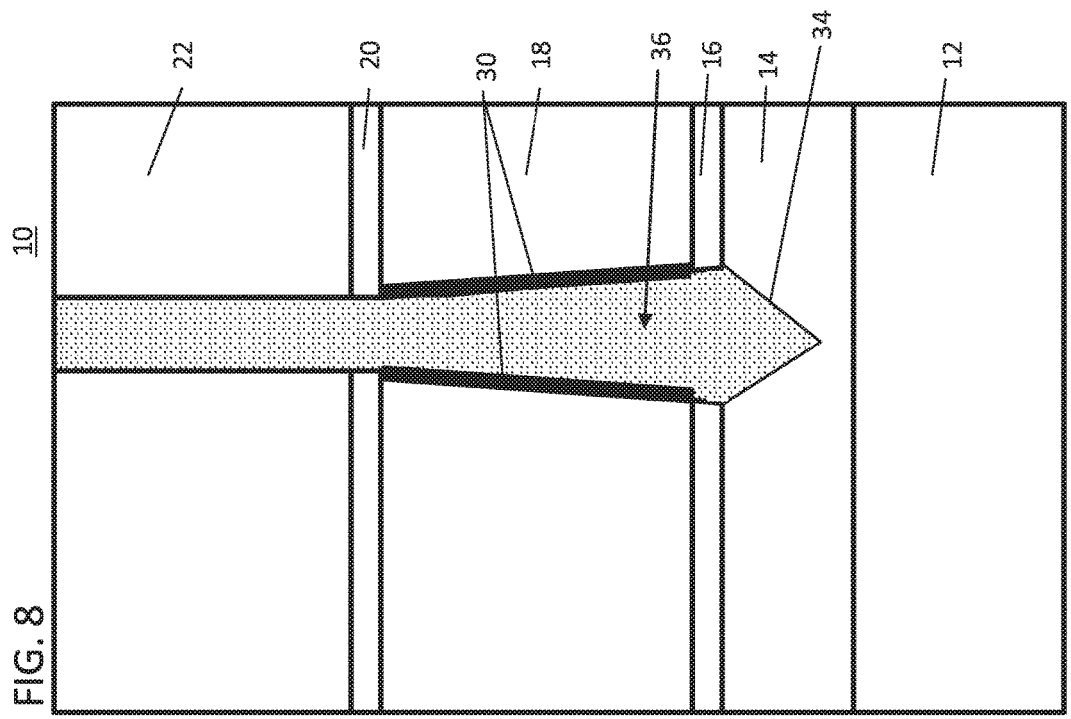
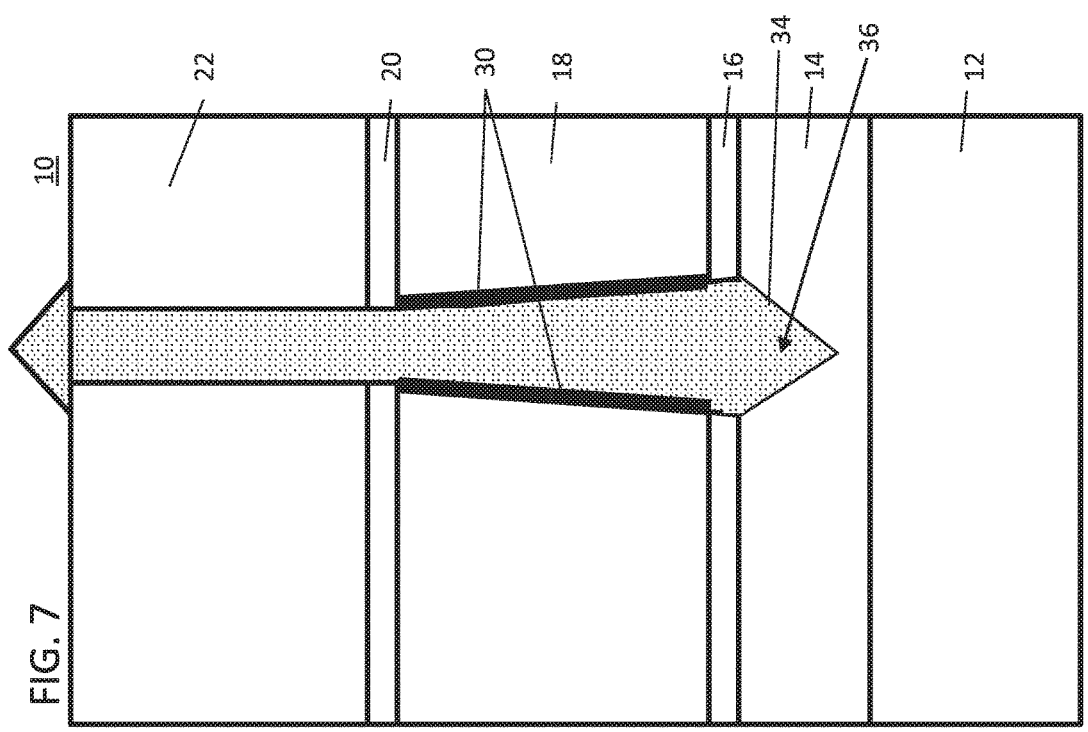

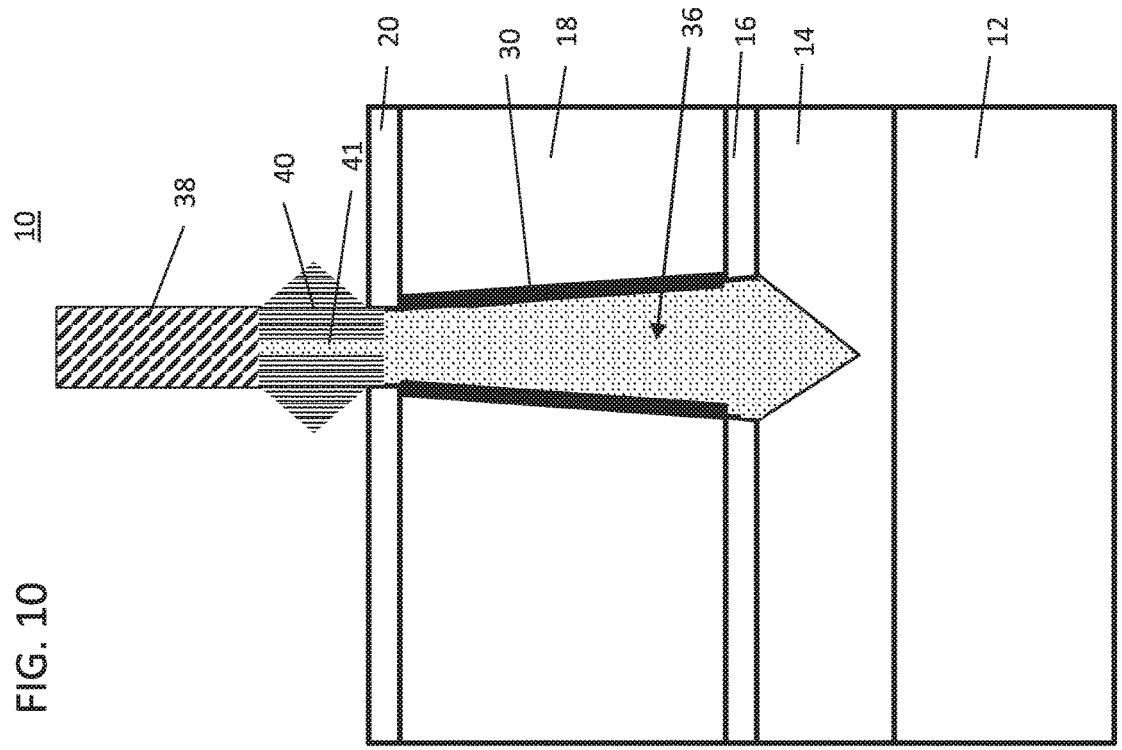
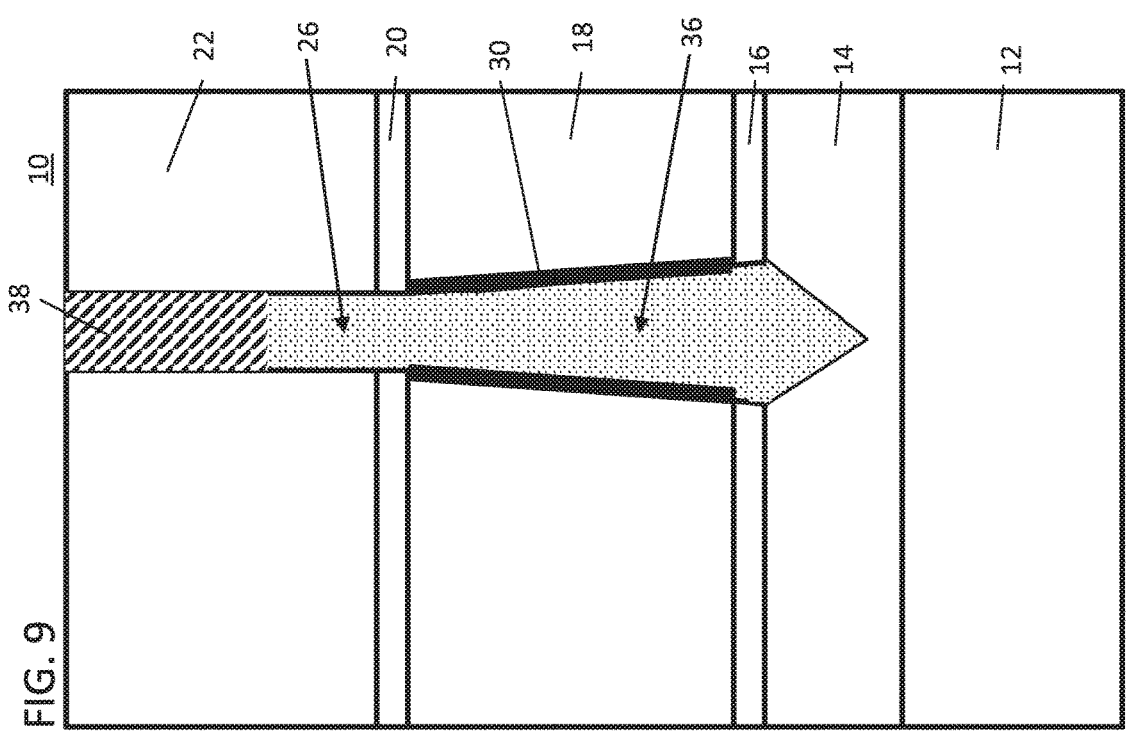

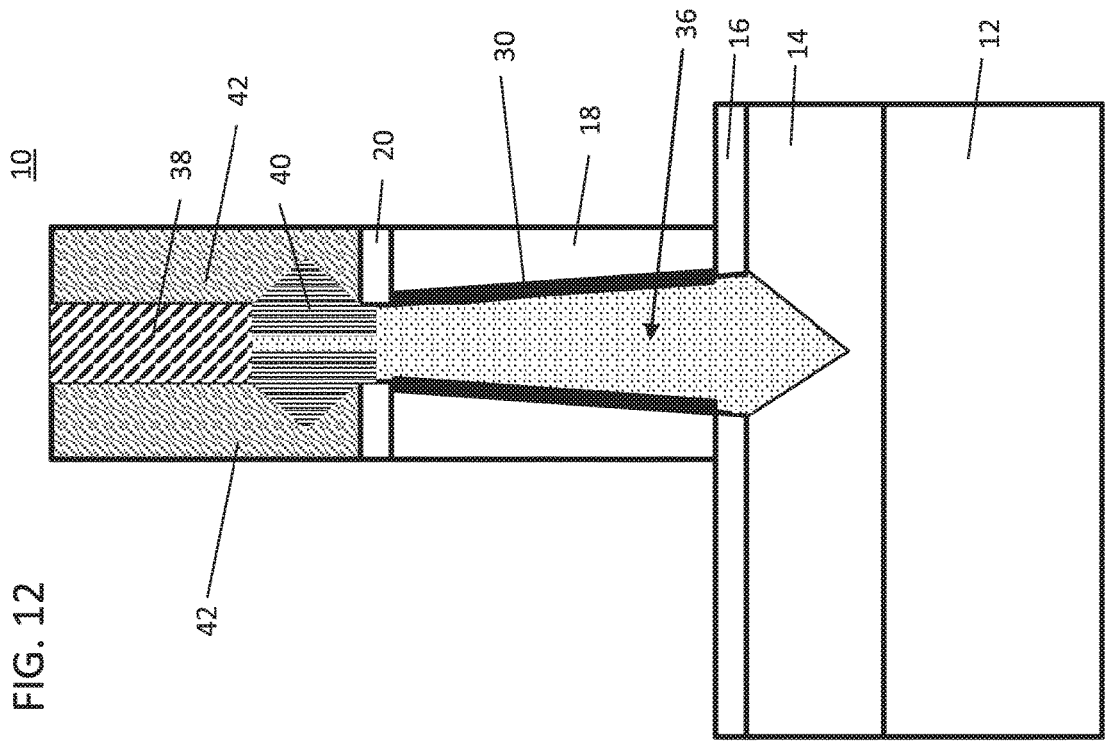
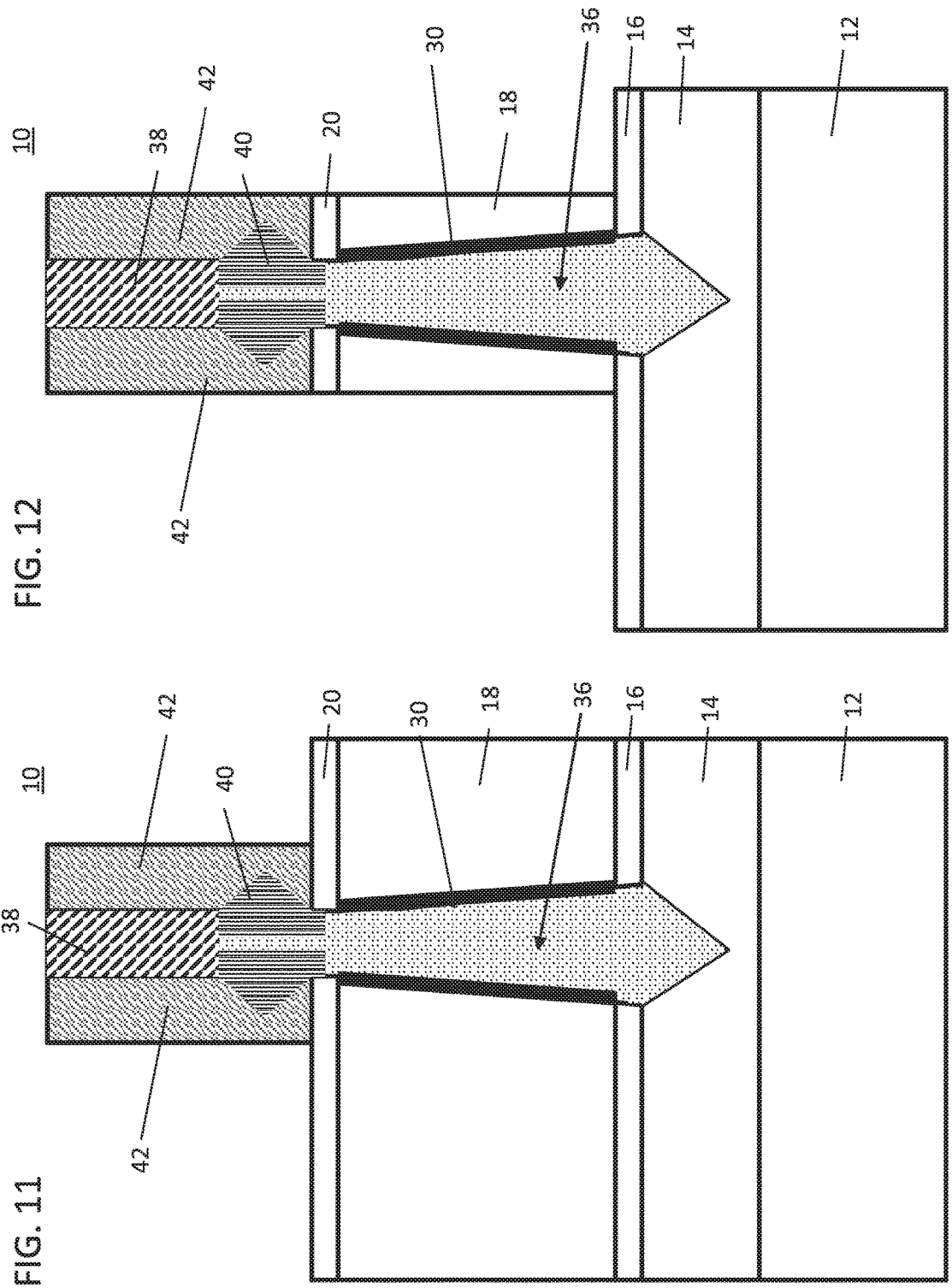

US 10,297,686 B2

TAPERED VERTICAL FET HAVING III-V CHANNEL

BACKGROUND

Technical Field

The present invention generally relates to semiconductor processing, and more particularly to devices and methods for forming a tapered vertical channel for a vertical transistor device.

Description of the Related Art

Vertical transistors are an attractive option for technology scaling, especially for 5 nm technologies and beyond. Concerns include variations in gate length, spacer thickness, and extension doping profiles due to integration challenges posed by a vertical orientation of the transistor.

SUMMARY

In accordance with an embodiment of the present principles, a vertical field effect transistor includes a first source/drain region formed on or in a substrate. A tapered fin is formed for a vertical device channel and has a first end portion attached to the first source/drain region. A second source/drain region is formed on a second end portion of the tapered fin. A gate structure surrounds the tapered fin.

Another vertical field effect transistor includes a first source/drain region formed on or in a substrate and a tapered fin forms a vertical device channel and has a first end portion attached to the first source/drain region. The tapered fin includes a III-V material and has a faceted portion to reduce defects in the device channel. A second source/drain region is formed on a second end portion of the tapered fin. A gate structure surrounds the tapered fin.

A method for fabricating a vertical field effect transistor includes forming a channel layer stack on a doped layer in a substrate; etching a taper into a dummy gate layer using a directional etch with isotropic properties; exposing a first source/drain region formed on or in the substrate; growing a tapered fin in the taper to form a vertical device channel on the first source/drain region; forming a second source/drain region on the tapered fin; and forming a gate structure surrounding the tapered fin.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 1 is a cross-sectional view showing a channel layer stack and a dielectric layer formed on a heavily doped layer in accordance with the present principles;

FIG. 2 is a cross-sectional view showing a device of FIG. 1 having a trench formed through the dielectric layer and a top spacer layer of the channel layer stack in accordance with the present principles;

FIG. 3 is a cross-sectional view showing the device of FIG. 2 having the trench extended into a dummy gate layer and formed into a tapered shape in accordance with the present principles;

FIG. 4 is a cross-sectional view showing the device of FIG. 3 having the trench extended into a bottom spacer layer of the channel layer stack in accordance with the present principles;

FIG. 5 is a cross-sectional view showing the device of FIG. 4 having an oxide formed within the trench in the dummy gate layer in accordance with the present principles;

FIG. 6 is a cross-sectional view showing the device of FIG. 5 having facets etched into the heavily doped layer in accordance with the present principles;

FIG. 7 is a cross-sectional view showing the device of FIG. 6 having a fin formed by epitaxial growth from the facets in the heavily doped layer in accordance with the present principles;

FIG. 8 is a cross-sectional view showing the device of FIG. 7 having excess fin material planarized in accordance with the present principles;

FIG. 9 is a cross-sectional view showing the device of FIG. 8 having fin material recessed and a cap formed in the recess in accordance with the present principles;

FIG. 10 is a cross-sectional view showing the device of FIG. 9 having the dielectric layer removed and a faceted source/drain region formed in accordance with the present principles;

FIG. 11 is a cross-sectional view showing the device of FIG. 10 having spacers formed on sides of the cap and the faceted source/drain regions in accordance with the present principles;

FIG. 12 is a cross-sectional view showing the device of FIG. 11 having the spacers employed as an etch mask to etch the top spacer layer and the dummy gate layer in accordance with the present principles;

DETAILED DESCRIPTION

Figure 13:
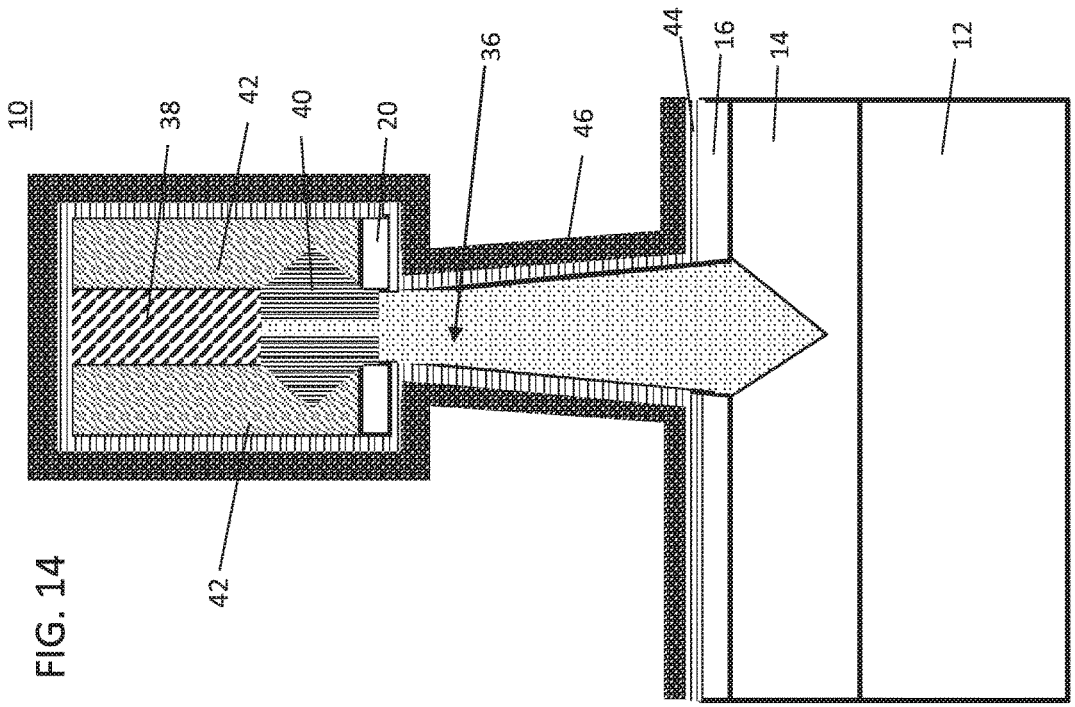
FIG. 13 is a cross-sectional view showing the device of FIG. 12 having the dummy gate layer and the oxide formed within the trench removed in accordance with the present principles.

In accordance with the present principles, vertical transistors and methods for fabrication are provided. III-V channel materials are attractive due to their high electron mobility. However, the relatively narrow bandgap of such materials as compared to silicon results in high off-state leakage currents. In accordance with the present principles, vertical transistors include a tapered channel structure. In one embodiment, the channel structure includes a wide channel source, and a narrow channel drain. In other embodiments, this may be reversed. The tapered channel structure employs bandgap modulation by quantum confinement effects, which can occur at relatively wide channel widths (e.g., as large as 15 nm) for group III-V semiconductors. A wide bandgap drain reduces the leakage current caused by band-to-band tunneling.

In some embodiments, pass-gates may be fabricated using traditional non-tapered channels, and an optional anneal of source/drain regions may be performed in addition to source/drain (S/D) epitaxy to increase an overlap compared to only in-situ epitaxial growth of S/D regions.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises." "comprising." "includes" and/or "including." when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower." "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

In various embodiments, the materials and layers may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions may be epitaxial processes, and the deposited material may be crystalline. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

Referring now to the drawings in which like numerals represent the same or similar elements and initially to FIG. 1, a partially fabricated semiconductor device 10 is shown in accordance with one embodiment. The device 10 includes a substrate 12, which may be a semiconductor or an insulator with an active surface semiconductor layer. The substrate may be crystalline, semi-crystalline, microcrystalline or amorphous. The substrate may be essentially (e.g., except for contaminants) a single element (e.g., silicon), primarily (e.g., with doping) of a single element, for example, silicon (Si) or germanium (Ge), or the substrate 12 may include a compound, for example, $Al_2O_3$, $SiO_2$, GaAs, SiC, or SiGe. The substrate 12 may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 12 may also have other layers forming the substrate 12, including high-k oxides and/or nitrides. In one or more embodiments, the substrate 12 may be a silicon wafer, a semiconductor formed on silicon (e.g., InP on GaAs on Si), etc. In various embodiments, the substrate 12 may be a single crystal silicon (Si), silicon germanium (SiGe), or III-V semiconductor (e.g., GaAs, InP) wafer, or have a single crystal silicon (Si), silicon germanium (SiGe), or III-V semiconductor (e.g., GaAs) surface/active layer. In the present embodiment, the substrate 12 will illustratively be described as InP, which may be formed on GaAs over Si.

A heavily doped layer or source/drain (S/D) region 14 may be formed on or within the substrate 12, where the doped layer 14 may be employed to form a S/D region from the bulk of substrate 12. In one or more embodiments, the S/D region 14 may be formed on a surface of the substrate 12. The S/D region 14 may be epitaxially grown on a crystalline surface of the substrate 12, where the S/D region 14 may have the same crystal structure as the underlying substrate. In various embodiments, the S/D region 14 may be InGaAs grown by epitaxy on the surface of the substrate 12. The S/D region 14 may be heavily doped, with e.g., Te or other suitable dopants.

The heavily doped layer 14 may be formed on a counter-doped layer. The heavily doped layer 14 may be n-doped or p-doped. The heavily doped layer 14 may have a dopant concentration in the range of about $1 \times 10^{19}$ to about $1 \times 10^{22}$ dopant atoms/cm$^3$. In various embodiments, the heavily doped layer 14 may form a source or a drain of a vertical finFET. It should be noted that a source and a drain may be interchanged, where the drain may be in the substrate below a vertical fin and the source may be formed on the top of a vertical fin.

In one or more embodiments, the counter-doped layer (not shown) and the heavily doped layer 14 may each be in-situ doped during epitaxial growth on a single crystal substrate. In various embodiments, dopants may be ion implanted into the counter-doped layer and/or the heavily doped layer 14. The counter-doped layer may include dopants of an opposite type relative to the heavily doped layer 14 to provide a depletion layer at the interface of the counter-doped layer and the heavily doped layer 14.

A bottom spacer layer 16, a dummy gate layer 18, a top spacer layer 20 and a dielectric layer 22 are formed over the heavily doped layer 14 in accordance with an exemplary embodiment.

In one or more embodiments, the bottom spacer layer 16 may be formed on an exposed surface of the heavily doped layer 14. The bottom spacer layer 16 may be a dielectric material other than a high-k dielectric, for example, silicon oxide (SiO), silicon nitride (SiN), or boron nitride (BN). The bottom spacer layer 16 may be deposited by chemical vapor deposition (CVD), physical layer deposition (PVD), atomic layer deposition (ALD), as well as modifications thereof, such as plasma enhanced (e.g., PECVD), metal organic (e.g., MOCVD), electron beam (e.g., EB-PVD), low pressure (e.g., LPCVD), etc., or combinations thereof. The bottom spacer layer 16 may act as an etch stop layer during fabrication processes. The thickness of the bottom spacer layer 16 may define the distance of a bottom edge of a gate structure from the heavily doped layer 14.

In one or more embodiments, the dummy gate layer 18 may be formed on the bottom spacer layer 16, which may provide a sacrificial template for forming a vertical channel and a gate structure on a channel. In various embodiments, the dummy gate layer 18 may be amorphous silicon (a-Si) or polycrystalline silicon (p-Si).

In one or more embodiments, the top spacer layer 20 may be formed on the dummy gate layer 18, where the top spacer layer 20 may be the same material as the bottom spacer layer 16. The top spacer layer 20 may be a dielectric material other than a high-k metal oxide dielectric, for example, silicon oxide (SiO), silicon nitride (SiN), silicon oxynitride (SiON), or boron nitride (BN). The top spacer layer 20 may have a different thickness than the bottom spacer layer 16.

The bottom spacer layer 140, dummy gate layer 150, and top spacer layer 160 may form a channel layer stack 21, where the channel layer stack 21 may provide a template for defining a vertical channel and/or forming a gate structure.

In one or more embodiments, the dielectric layer 22 may be formed on the top spacer layer 20, where the dielectric layer 22 may be a sacrificial layer blanket deposited on the top spacer layer 20. The layer 22 may be silicon oxide (SiO), which may be formed by a CVD deposition or a PVD deposition. The layer 22 may be a different material than the top spacer layer 20, such that the top spacer layer 20 may act as an etch stop layer.

Referring to FIG. 2, a trench 24 is formed from the layer 22 to the top spacer layer 20 in a first RIE. A photo mask layer may be a temporary resist (e.g., PMMA) that may be deposited on the layer 22, patterned, and developed. The photo mask layer may be a positive resist or a negative resist. One or more openings may be patterned in the photo mask layer for forming one or more trenches 24 through the dielectric layer 22 and in the channel layer stack 21. The size and placement of the openings in the photo mask layer may define the width, length, and pitch of the one or more openings, and thereby, the width, length, and pitch of the one or more vertical fins. Another RIE may be performed to etch through the top spacer layer 20.

The one or more suitable etching processes (e.g., RIEs) may be utilized to remove material from the dielectric layer 22 and the top spacer layer 20 to form trench 24 where the underlying material may act as an etch stop layer for each of the one or more etching processes sequentially utilized to form the trench 24.

Referring to FIG. 3, etch chemistry is adjusted to etch the dummy gate layer 18 through the trench 24 down to the bottom spacer layer 16 to form a tapered fin trench 26, where the underlying material may act as an etch stop layer for each of the one or more etching processes sequentially utilized to form the fin trench 26. In various embodiments, the fin trench 26 may be etched using a RIE process with isotropic properties so that a tapered shape 28 is formed in the sidewalls of the fin trench 26. The isotropic etch may include dopant ions with their chemistry or energy tuned to etch more material deeper in the trench 26 than in an upper portion of the trench 26. The tapered shape 28 may include a wider portion up to 15 nm wide with the narrower portion ranging from a minimum node dimension to just less than the dimension of the wider portion.

Referring to FIG. 4, another RIE process is performed to break through the bottom spacer layer 16. A same RIE process or different RIE may be employed to etch the bottom spacer layer 16 and expose the underlying heavily doped layer 14. The etch is performed selective to the underlying heavily doped layer 14.

Referring to FIG. 5, after formation of the one or more fin trenches 26, at least a portion of the channel layer stack 21 inside the one or more fin trenches 26 may be oxidized to form a dummy layer liner 30. In various embodiments, the dielectric layer 22, top spacer layer 20, dummy gate layer 18, and bottom spacer layer 16 may be exposed to oxidation, where the exposed portion of the dummy gate layer 18 inside the fin trench 26 may be oxidized to form a dummy layer liner 30. The dummy layer liner 30 may surround the trench 26 at the level of the dummy gate layer 18. The dummy layer liner 30 may protect the interface between the vertical fin and the dummy gate layer during epitaxial growth and/or subsequent processes, where the dummy layer liner 30 may avoid an amorphous crystal structure of the dummy gate layer interfering with the epitaxial growth.

In various embodiments, the dummy layer liner 30 may be formed by plasma oxidation or thermal oxidation of the sidewalls of the dummy gate layer 18 within the fin trench 26. In various embodiments, thermal oxidation may be done using an oxidizing gas (e.g., $O_2$, $O_3$, etc.) at temperatures in the range of about 600° C. to about 1200° C. The oxidation of the dummy gate layer material (e.g., a-Si) may form $SiO_2$. The dummy layer liner 30 may be grown on the exposed surfaces of the dummy gate layer 18 inside the trench 26 by a plasma oxidation, where the oxide grows selectively only on the dummy gate layer material to form the dummy layer liner 30.

In various embodiments, the sidewalls of the dummy gate layer 18 within the fin trenches 26 may be oxidized after extending the fin trenches 26 through the bottom spacer layer 16 to the surface of the heavily doped layer 14. In various embodiments, a trench may be etched all the way down to the heavily doped layer 14.

Referring to FIG. 6, an optional crystalline orientation etch may be performed within the fin trench 26 to create facets 34 at a bottom portion 32 of the fin trench 26. The faceted bottom portion 32 may be formed using a hot acid etch process, wet etch or any other suitable process that selectively etches the heavily doped layer 14 in accordance with crystallographic planes. The facets 34 provide trapping of epitaxial growth defects when a heteroepitaxial growth process is employed to grow fins to form a vertical channel, as will be described.

Referring to FIG. 7, a vertical fin or vertical channel 36 is grown in the fin trench 26 (FIG. 6). The fin 36 may include a III-V channel material (e.g., lightly doped InGaAs). If facets 34 are present, any epitaxial defects will be trapped in the faceted bottom 36 so the defects will not get into a channel region (within dummy gate layer 18).

The vertical fin 36 may be formed within each of the one or more fin trenches 26. The one or more vertical fins 36 may be formed by epitaxial growth from the exposed surface of the heavily doped layer 14. In various embodiments, the heavily doped layer 14 may have a <100> or <111> crystal orientation, and the vertical fins 36 may be formed with the same crystal orientation as the heavily doped layer 14. The heavily doped layer 14 may have the same crystal orientation as the bulk substrate or an active layer on a SeOI substrate. In various embodiments, the top surface of the vertical fins 36 may have a <100> crystal orientation. By forming the vertical fin(s) 36 on the heavily doped layer 14, the source-channel junction is self-aligned at the common interface.

In various embodiments, the one or more vertical fins 36 are formed on the heavily doped layer 14, where regions of the heavily doped layer may be isolated by shallow trench isolation (STI) regions (not shown) in the substrate 12, wherein the heavily doped region 14 in the substrate 12 may act as a source or a drain for a vertical field effect transistor (VFET), and the vertical fins 36 act as a channel for the VFET.

In one or more embodiments, the vertical fins 36 preferably include a III-V material although other materials may be employed. The vertical fins 36 may include gallium arsenide (GaAs), indium gallium arsenide (InGaAs), indium arsenide (InAs), indium aluminum arsenide (InAlAs), etc. The vertical fins 36 may be single crystal epitaxially grown on the heavily doped layer 14. The vertical fins 36 may extend above the surface of the dielectric layer 22 and expand laterally due to different growth rates of the different crystal faces.

In one or more embodiments, the one or more vertical fins 36 may have a width in the range of about 4 nm to about 20 nm, or may have a width in the range of about 8 nm to about 15 nm, or may have a width in the range of about 10 nm to about 12 nm, and a length in the range of about 30 nm to about 300 nm, or about 50 nm to about 150 nm.

Referring to FIG. 8, a planarization process is performed to level off a top surface and remove excess epitaxial material. In one embodiment, the planarization process includes a chemical mechanical polish (CMP), although an etch process may be performed.

Referring to FIG. 9, the vertical fin 36 is recessed into the trench 26. In one or more embodiments, a fraction of the vertical fin 36 is removed from an upper portion of fin trench 26 to form a recess. The height of the vertical fin 36 may be reduced, such that the top surface of the vertical fin 36 is below the top surface of the dielectric layer 22 but above the top surface of the top spacer layer 20. In various embodiments, the fraction of the vertical fin 36 may be removed by a selective etch, where the selective etch may be a wet etch or a blanket RIE.

A fill or cap 38 may be formed in the recess within the trench 26, where the fill may include silicon nitride. The fill or cap 38 may extend above the top of the recesses and form at least a partial layer over dielectric layer 22. The partial layer of the fill 38 extending above the top surface of the dielectric layer 22 may be removed by CMP.

Referring to FIG. 10, the dielectric layer 22 above the top spacer layer 20 may be selectively removed to expose at least an upper portion of a vertical fin 36. In various embodiments, the dielectric layer 22 may be removed by a wet etch and/or a blanket RIE.

The vertical fin 36 is etched to form a thinned portion 41 above the top spacer later 20 in accordance with an exemplary embodiment. In one or more embodiments, a width of an upper portion of the one or more vertical fin(s) 36, approximately between the cap 38 and the top spacer layer 20, may be reduced by selective etching of particular crystal faces of the one or more vertical fin(s) 36. At least an upper portion of the one or more vertical fin(s) 36 may thereby be thinned.

In various embodiments, etching the sides of an upper portion of the vertical fin 36 may also remove vertical fin material below the top surface of the top spacer layer 20. In one or more embodiments, the thinned portion of the vertical fin(s) 36 may have a width in the range of about 2 nm to about 3 nm.

A doped material forming a top source/drain region 40 may be formed on the one or more vertical fin(s) 36. The top source/drain region 40 may be formed by epitaxial growth on the exposed surface of the thinned portion of the vertical fin(s) 36, such that the vertical fin 36 and the top source/drain region 40 have the same crystal orientation. The top source/drain region 40 may be n-doped or p-doped. The top source/drain may be doped in-situ during deposition of the top source/drain region 40.

The S/D epitaxy to form S/D region 40 may include a tunable wide bandgap III-V material (e.g., InAlGaAs that can be tuned in accordance with a percentage of Al in the compound).

In various embodiments, the locations of the source and drain of a vertical transistor may be reversed such that the drain is on the top of a vertical fin, while the source is at the bottom. The source may, therefore, be at the bottom or the top.

Referring to FIG. 11, a dielectric material, for example, a silicon oxide, may be formed on the top spacer layer 20 and cover the cap 38 and the source/drain region 40 on the vertical fin(s) 36. The dielectric material may be blanket deposited over the cap 38 and the source/drain region 40. In various embodiments, the height of the dielectric material may be reduced by CMP and/or etching. The dielectric material may be patterned and portions removed to expose portions of the underlying top spacer layer 20 and to form vertical spacers 42. The vertical spacers 42 may act as a hardmask for removing portions of the top spacer layer 20 and the dummy gate layer 18.

Referring to FIG. 12, a portion of the top spacer layer 20 and a portion of the dummy gate layer 18 may be removed. The top spacer layer 20 and the dummy gate layer 18 may be removed by a directional RIE using the vertical spacers 42 and cap 38 as an etch mask.

Referring to FIG. 13, the dummy gate layer 18 is removed from the vertical fin 36 in accordance with an exemplary embodiment. The remaining portion of the dummy gate layer 18 may be removed selective to the dummy layer liners 30 on the vertical fin 36. The remaining portions of the dummy gate layer 18 may be removed by a wet chemical etch. In one or more embodiments, the dummy layer liners 30 on the vertical fins 36 may be removed by a wet etch or RIE, where the wet etch or RIE may selectively remove silicon oxide.

Figure 14:
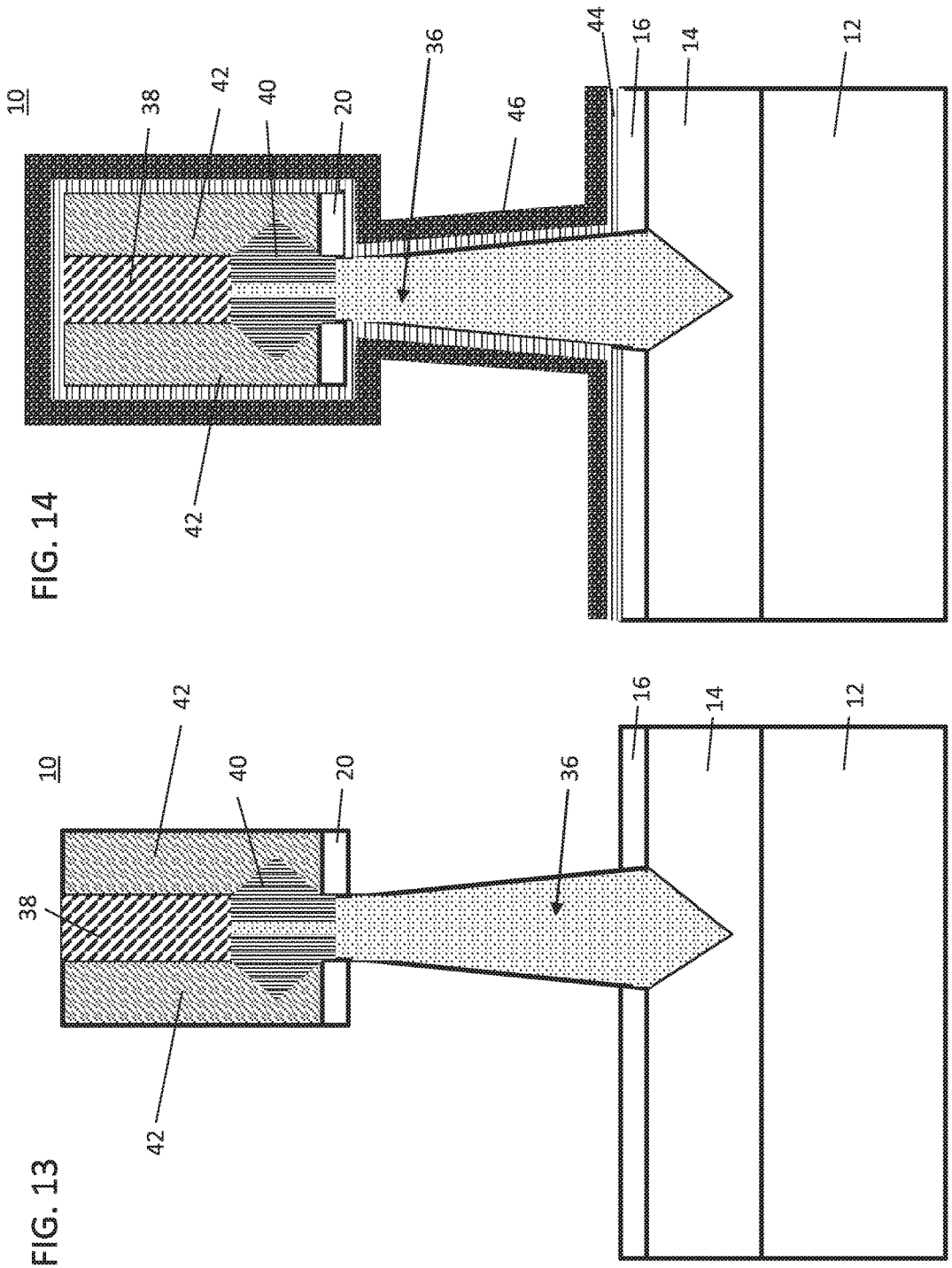
FIG. 14 is a cross-sectional view showing the device of FIG. 13 having a gate dielectric and a work function metal layer conformally deposited in accordance with the present principles.

Referring to FIG. 14, a gate dielectric layer 44 may be formed on the vertical fin 36, bottom spacer layer 16, and spacers 42, where the gate dielectric layer 44 may be conformally deposited. The gate dielectric layer 44 may be conformally deposited by ALD and/or CVD. In various embodiments, the gate dielectric layer 44 may be a high-k material, including but not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SiTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k dielectric material may further include dopants such as lanthanum and/or aluminum. The stoichiometry of the high-k dielectric material may vary. In various embodiments, the gate dielectric layer 44 may have a thickness in the range of about 1.5 nm to about 2.5 nm.

In one or more embodiments, a work function layer 46 may be deposited over the gate dielectric layer 44, where the work function layer 46 may be conformally deposited by ALD and/or CVD. The work function layer 46 may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), tantalum carbide (TaC), hafnium carbide (HfC), and combinations thereof. In various embodiments, the work function layer 44 may have a thickness in the range of about 1 nm to about 11 nm, or may have a thickness in the range of about 2 nm to about 5 nm.

Figure 15:
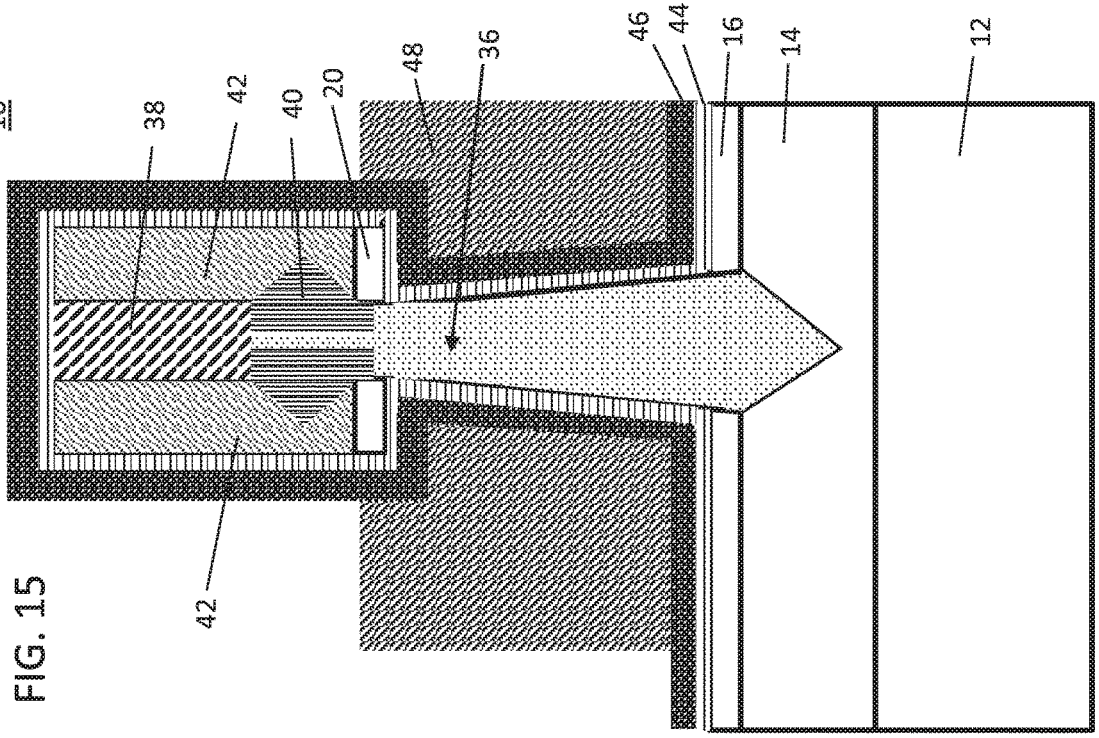
FIG. 15 is a cross-sectional view showing the device of FIG. 14 having a gate conductor deposited, recessed and patterned in accordance with the present principles.

Referring to FIG. 15, a gate metal 48 or additional gate conductor material (not shown) may be formed on the work function layer 46. The gate metal layer 48 may be deposited by atomic layer deposition (ALD) or CVD. In various embodiments, the gate metal layer 48 may be tungsten (W), aluminum (Al), titanium nitride (TiN), cobalt (Co), etc. or a combination thereof. The gate metal layer 48 is planarized, (e.g., CMP) and recessed by and etch process followed by patterning (e.g., lithography) to shape the gate metal layer 48.

In one or more embodiments, the gate dielectric layer 44, work function layer 46 and the gate metal layer 48 may be removed from at least a portion of the bottom spacer layer 16 to form a gate structure on the vertical fins 36. In various embodiments, each layer may be removed by a suitable directional etching process (e.g., RIE), where the underlying layer may act as an etch stop layer.

Figure 16:
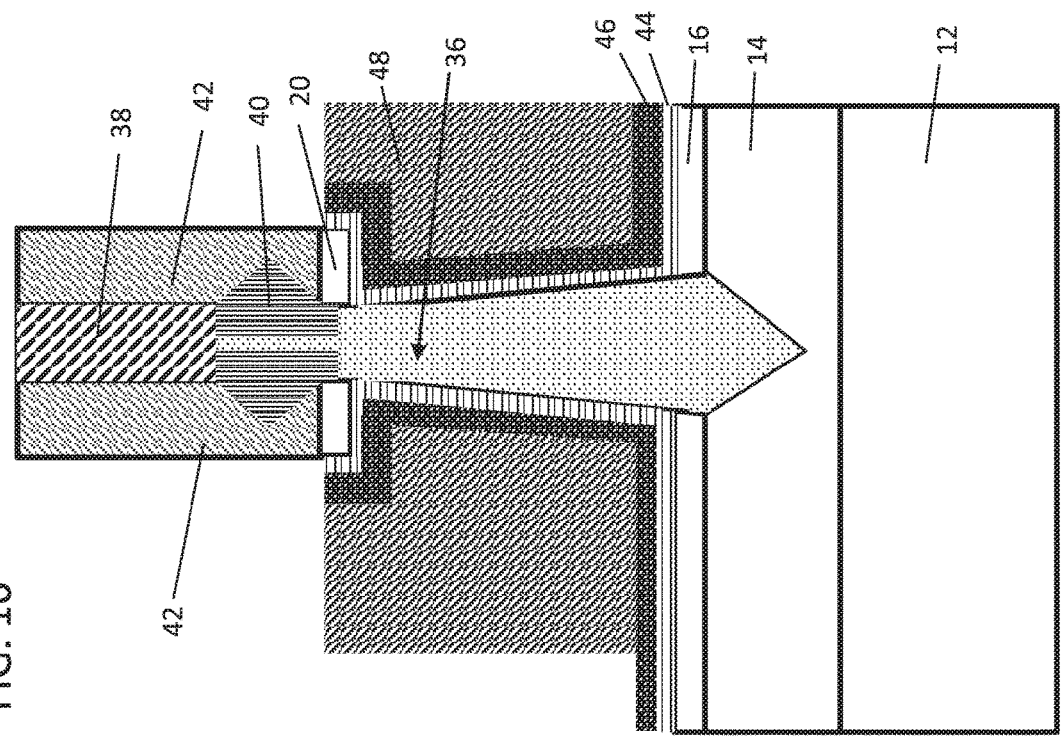
FIG. 16 is a cross-sectional view showing the device of FIG. 15 having the gate dielectric and the work function metal layer recessed to the gate conductor in accordance with the present principles.

Referring to FIG. 16, space above the gate metal layer 48 is etched by a RIE or similar etch process to remove portions of the gate dielectric 44 and the work function metal layer 46. The gate dielectric 44 and the work function metal layer 46 are removed from the cap 38 and spacers 42.

Figure 17:
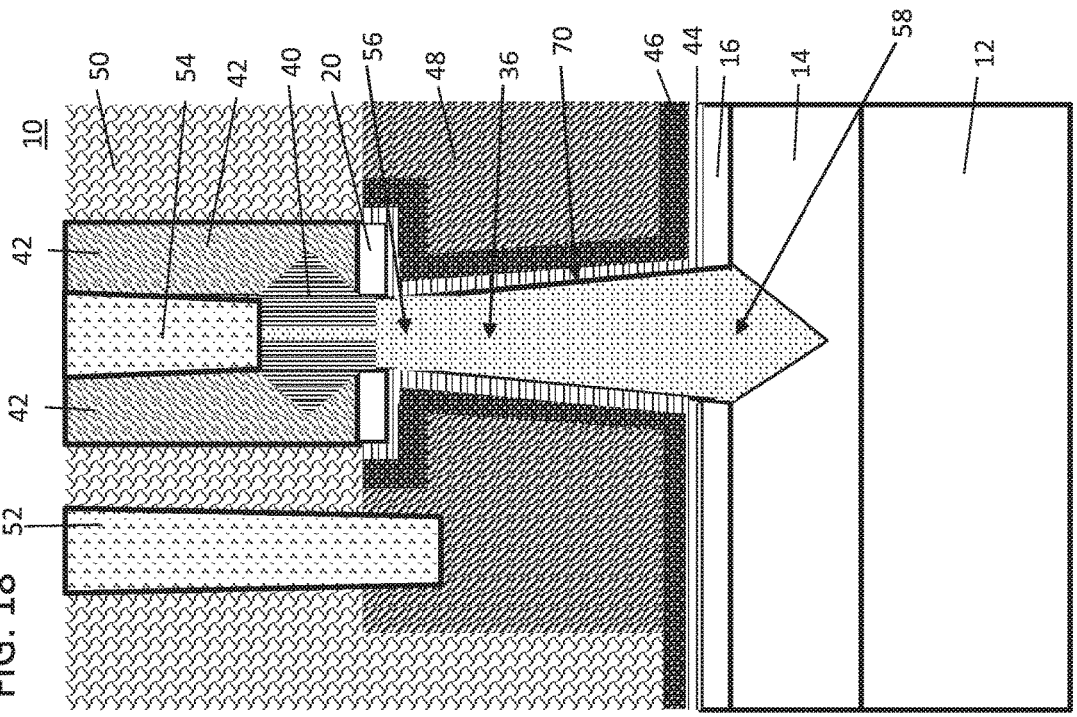
FIG. 17 is a cross-sectional view showing the device of FIG. 16 having an interlevel dielectric deposited in accordance with the present principles.

Referring to FIG. 17, a dielectric fill 50 (e.g., interlevel dielectric (ILD) is deposited to fill in the space between neighboring structures, including vertical fins 36 and provide electrical insulation between devices and components. The dielectric fill 50 may include an oxide.

Figure 18:
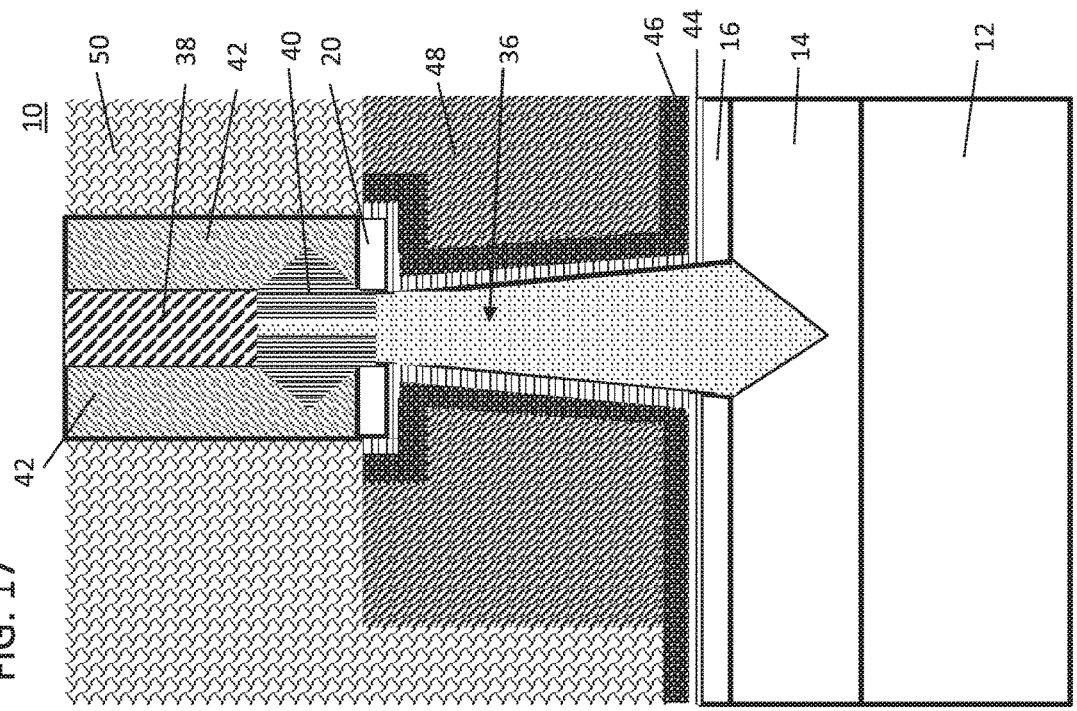
FIG. 18 is a cross-sectional view showing the device of FIG. 17 having a contact formed through the interlevel dielectric to form a vertical transistor in accordance with the present principles.

Referring to FIG. 18, middle-of-line contacts may be formed, where the gate, source and drain contacts may be made to the transistor components using any process for making contacts. One or more trenches may be formed in the dielectric fill 50 by masking, patterning, and etching. The trench(es) may extend vertically down through the dielectric fill 50 to the gate conductor layer 48 to form metal contacts 52 for back end of line (BEOL) electrical connections to the gate structure(s).

In various embodiments, trenches may be etched vertically down through the dielectric material 50 to the top source/drain region 40 to form metal contacts 54 to the vertical finFET. The cap 38 may be removed to allow access to the top surface of the top source/drain region 40.

In various embodiments, the trench(es) may be filled with a barrier layer (not shown) and/or a metal contact fill. The barrier layer may be selectively formed in trench(es) formed in the dielectric material 50 to the top source/drain region 40. The barrier layer may be selectively formed in the dielectric material 50 to the gate conductor layer 48. The barrier layer is optional.

In one or more embodiments, a metal contact fill for forming contacts 52, 54 may include tungsten (W), aluminum (Al), copper (Cu) or other suitable material. In various embodiments, the barrier layer may be titanium nitride (TiN), tantalum nitride (TaN), hafnium nitride (HfN), niobium nitride (NbN), tungsten nitride (WN), or combinations thereof, where the barrier layer may prevent diffusion and/or alloying of the metal contact fill material with the top source drain material 40 and/or gate conductor 48. In various embodiments, the barrier layer may be conformally deposited in the trench(es) by ALD, CVD, MOCVD, PECVD, or combinations thereof. In various embodiments, the contact metal may be formed by ALD, CVD, and/or PVD to form the electrical contacts. In various embodiments, the top surfaces of the contacts 52, 54 and dielectric fill 50 may be planarized (e.g., CMP) to provide a uniform surface.

The structure depicted in FIG. 18 provides a tapered channel region (fin 36) having a narrow top portion 56 that interfaces with S/D region 40 (e.g., a drain). This provides a wider bandgap, which is desirable for lower band-to-band-tunneling (BTBT) leakage. In addition, a wide bottom portion 58 (e.g., a source) provides a narrower bandgap, which is desirable for a larger transconductance of a vertical field effect transistor 70 formed in accordance with the present principles. The S/D regions 40, 14 and channel 36 can be annealed to increase dopant overlap between the regions.

Figure 19:
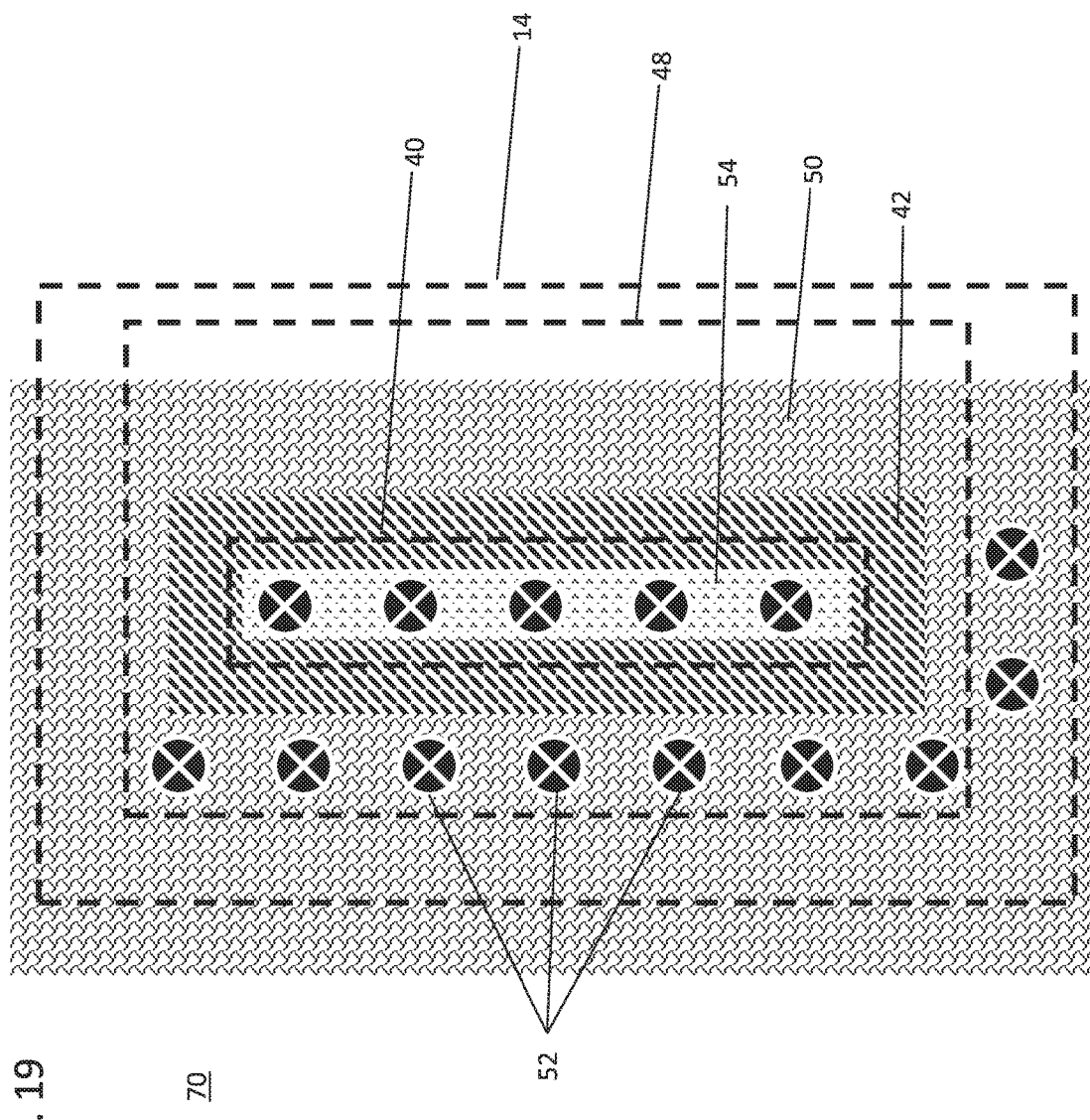
FIG. 19 is a top view showing the device of FIG. 18 having outlines of a source, a drain and a gate shown for a vertical transistor in accordance with the present principles.

Referring to FIG. 19, a top view is shown of the structure in FIG. 18 that provides a layout. The view shows metal with contacts 54 surrounded by spacers 42. Contacts 52 are provided outside the spacers 42 through the ILD 50. The vertical field effect transistor 70 includes a source region (14) a drain region (40) and a gate region (48). It should be understood that in some embodiments the source and drain regions may be reversed.

Figure 20:
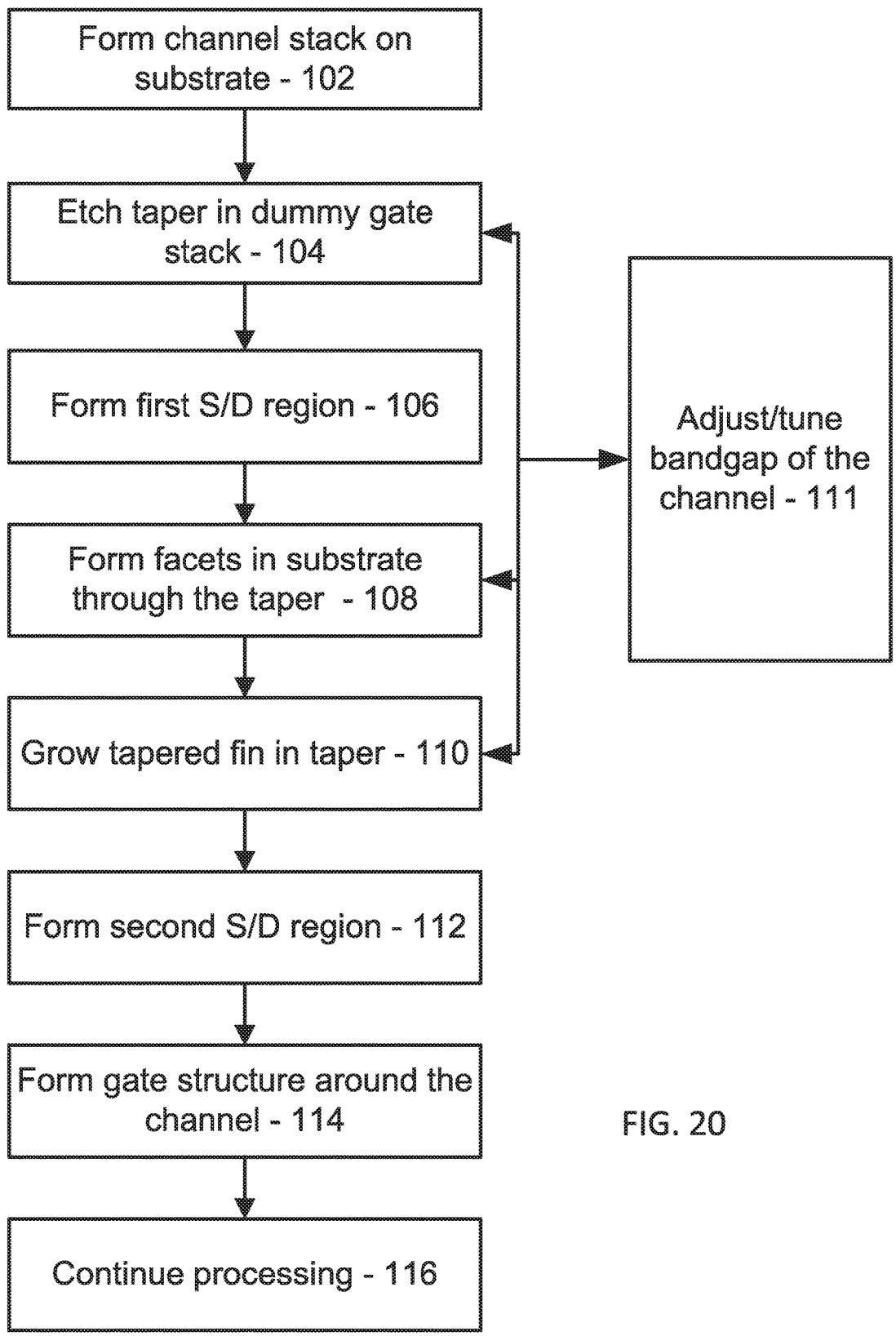
FIG. 20 is a block/flow diagram showing a method for fabrication a vertical transistor with a tapered vertical channel in accordance with the present principles.

Referring to FIG. 20, methods for fabricating a vertical field effect transistor are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a channel layer stack is formed on a doped layer in a substrate. In block 104, a taper is etched into a dummy gate layer using a directional etch with isotropic properties. In block 106, a first source/drain region formed on or in the substrate is exposed. The first source/drain region may include a heavily doped layer in the substrate.

In block 108, facets may be formed in the substrate by performing an etch that exposes the facets in accordance with crystallographic planes of the substrate material. In block 110, a tapered fin is grown in the taper to form a vertical device channel on the first source/drain region. The tapered fin may be formed in the facets to provide a faceted portion of the tapered fin to reduce defects in the device channel. The tapered fin may include a III-V material. The tapered fin may be wider in contact with the first source/drain region and may include a width or up to 15 nm at its widest portion. Other dimensions are contemplated.

In block 111, the taper and the tapered fin may be adjusted or tuned to achieve a desired bandgap. A modulated bandgap may be achieved due to quantum confinement (dimensional bandgap adjustments). This is achieved in accordance with a taper shape formed in block 104 and/or during a facet etch in block 108. A bandgap of the vertical device channel may be tuned by adjusting a composition of the second source/drain region during formation. This may include, e.g., a III-V material for the second source/drain region with the bandgap tuned in accordance with aluminum content of the second source/drain region. The compositional tuning may occur during growth of the tapered fin (device channel) in block 110.

In block 112, a second source/drain region is formed on the tapered fin. In one embodiment, the first source/drain region includes a source, and the second source/drain region includes a drain wherein a wider portion of the tapered fin is connected to the source. In block 114, a gate structure is formed surrounding the tapered fin. In block 116, processing continues to complete the device.

Having described preferred embodiments for tapered vertical FET having III-V channel (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A vertical field effect transistor, comprising:
a first source/drain region formed on or in a substrate;
a tapered fin forming a vertical device channel and having a first end portion attached to the first source/drain region;
a second source/drain region formed on a second end portion of the tapered fin; and
a gate structure surrounding the tapered fin.

2. The transistor as recited in claim 1, wherein the tapered fin includes a III-V material.

3. The transistor as recited in claim 1, wherein the first end portion is wider than the second end portion and the first end portion includes a width of up to 15 nm.

4. The transistor as recited in claim 1, wherein the first end portion includes a faceted portion to reduce defects in the device channel.

5. The transistor as recited in claim 1, wherein the second source/drain region includes a faceted region grown on the tapered fin.

6. The transistor as recited in claim 1, wherein the first source/drain region includes a source and the second source/drain region includes a drain wherein a wider portion of the tapered fin is connected to the source.

7. The transistor as recited in claim 1, wherein the tapered fin includes a narrow portion lower hand-to-hand-tunneling (BTBT) leakage and a wider portion to increase transconductance of the transistor.

8. vertical field effect transistor, comprising:
a first source/drain region formed on or in a substrate;
a tapered fin forming a vertical device channel and having a first end portion attached to the first source/drain region, the tapered fin including a III-V material and having a faceted portion to reduce defects in the device channel;
a second source/drain region formed on a second end portion of the tapered fin; and
a gate structure surrounding the tapered fin.

9. The transistor as recited in claim 8, wherein the first end portion is wider than the second end portion and the first end portion includes a width of up to 15 nm.

10. The transistor as recited in claim 8, wherein the second source/drain region includes a faceted region grown on the tapered fin.

11. The transistor as recited in claim 7, wherein the first source/drain region includes a source and the second source/drain region includes a drain wherein a wider portion of the tapered fin is connected to the source.

12. The transistor as recited in claim 7, wherein the tapered fin includes a narrow portion to lower band-to-band-tunneling (BTBT) leakage and a wider portion to increase transconductance of the transistor.

13. A vertical field effect transistor, comprising:
a tapered fin forming a vertical device channel and having a first end portion attached to a first source/drain region at a bottom of the fin and a second source/drain region formed on a second end portion on top of the tapered fin; and
a gate structure surrounding the vertical channel of the tapered fin.

14. The transistor as recited in claim 13, wherein the tapered fin includes a III-V material.

15. The transistor as recited in claim 13, wherein the first end portion is wider than the second end portion and the first end portion includes a width of up to 15 nm.

16. The transistor as recited in claim 13, wherein the first end portion includes a faceted portion to reduce defects in the device channel.

17. The transistor as recited in claim 13, wherein the second source/drain region includes a faceted region grown on the tapered fin.

18. The transistor as recited in claim 13, wherein the first source/drain region includes a source and the second source/drain region includes a drain wherein a wider portion of the tapered fin is connected to the source.

19. The transistor as recited in claim 13, wherein the tapered fin includes a modulated bandgap due to quantum confinement.

20. The transistor as recited in claim 13, wherein the tapered fin includes a narrow portion to lower band-to-band-tunneling (BTBT) leakage and a wider portion to increase transconductance of the transistor.

* * * * *